(12) United States Patent
Jin et al.

(10) Patent No.: US 9,451,736 B2
(45) Date of Patent: Sep. 20, 2016

(54) HIGH LOAD AND HIGH PRECISION POLYGONAL GUIDE

(75) Inventors: Moon-young Jin, Daegu (KR);
Choong-rae Cho, Daegu (KR);
Min-seok Hong, Gyeongsan-si (KR)

(73) Assignee: Samick Precision Ind. Co., Ltd., Daegue (KR)

( * ) Notice: Subject to any disclaimer, the term of this patent is extended or adjusted under 35 U.S.C. 154(b) by 212 days.

(21) Appl. No.: 14/349,780

(22) PCT Filed: Jan. 5, 2012

(86) PCT No.: PCT/KR2012/000117
§ 371 (c)(1),
(2), (4) Date: Apr. 4, 2014

(87) PCT Pub. No.: WO2013/051764
PCT Pub. Date: Apr. 11, 2013

(65) Prior Publication Data
US 2014/0237812 A1    Aug. 28, 2014

(30) Foreign Application Priority Data

Oct. 5, 2011 (KR) .......................... 10-2011-0101314
Oct. 5, 2011 (KR) .......................... 10-2011-0101317
Nov. 8, 2011 (KR) .......................... 10-2011-0115850

(51) Int. Cl.
| *B23P 19/00* | (2006.01) |
| *H05K 13/04* | (2006.01) |
| *H01L 21/683* | (2006.01) |
| *F16H 19/02* | (2006.01) |

(52) U.S. Cl.
CPC ........ *H05K 13/0408* (2013.01); *F16H 19/025* (2013.01); *H01L 21/6838* (2013.01); *H05K13/0404* (2013.01); *H05K 13/0413* (2013.01); *Y10T 29/53191* (2015.01); *Y10T 74/18568* (2015.01)

(58) Field of Classification Search
CPC ................ Y10T 279/17752; Y10T 29/49853; Y10T 29/49691; F16C 29/04
USPC .................................... 29/743, 724, 773, 787
See application file for complete search history.

(56) References Cited

U.S. PATENT DOCUMENTS 8,092,097 B2 * 1/2012 Ohashi .......................... 384/470
8,317,404 B2 * 11/2012 Sato .................... F16C 33/3887
384/523

FOREIGN PATENT DOCUMENTS

| KR | 200384987 Y1 | 5/2005 |
| KR | 100668200 B1 | 1/2007 |
| KR | 100785329 B1 | 12/2007 |
| KR | 1020080090603 A | 10/2008 |

OTHER PUBLICATIONS

PCT International Search Report for PCT Counterpart Application No. PCT/KR2012/000117, 7 pgs., (Sep. 24, 2012).

* cited by examiner

*Primary Examiner* — Thiem Phan
(74) *Attorney, Agent, or Firm* — Blakely, Sokoloff, Taylor & Zafman LLP

(57) ABSTRACT

The present invention relates to a high load and high precision polygonal guide, and to a picker actuator using same, wherein the polygonal guide includes: an integrated ball cage designed and formed in a polygon and having a plurality of ball receiving holes formed on each side of the polygonal ball cage for receiving balls; a housing having a polygonal through hole for rolling motion such that, after the balls are inserted into the ball receiving holes formed on each side of the polygonal ball cage, the balls cannot escape from the ball receiving holes; and a guide post inserted and fitted inside the polygonal ball cage into which the balls are inserted and fitted, whereby the guide post or the housing reciprocates in a straight line by the rolling motion of the balls.

4 Claims, 5 Drawing Sheets

HIGH LOAD AND HIGH PRECISION POLYGONAL GUIDE

CROSS-REFERENCE TO RELATED APPLICATIONS

This patent application is a U.S. National Phase Application under 35 U.S.C. §371 of International Application No. PCT/KR2012/000117, filed Jan. 5, 2012, entitled HIGH LOAD AND HIGH PRECISION POLYGONAL GUIDE, AND PICKER ACTUATOR USING SAME, which claims priority to Korean Patent Application No. 10-2011-0101314, filed Oct. 5, 2011, Korean Patent Application No. 10-2011-0101317, filed Oct. 5, 2011, and Korean Patent Application No. 10-2011-0115850, filed Nov. 8, 2011.

TECHNICAL FIELD

The present invention relates to a high load and high precision polygonal guide, and to a picker actuator using the same, wherein the polygonal guide includes: an integrated ball cage designed and formed in a polygon and having a plurality of ball receiving holes formed on each side of the polygonal ball cage for receiving balls; a housing having polygonal through holes for rolling motion such that, after the balls are inserted and fitted into the ball receiving holes formed on each side of the polygonal ball cage, the balls cannot escape from the ball receiving holes; and a guide post inserted and fitted inside the polygonal ball cage into which the balls are inserted and fitted, whereby the guide post or the housing reciprocates in a straight line by the rolling motion of the balls.

BACKGROUND ART

A picker actuator is applied to a system for transferring small components such as, mostly, a semiconductor chip or a LED chip, and actually a pick and place actuator is designed, formed and being used by applying an air pressure cylinder in the field. A guide, which is adapted to an existing picker actuator, is designed and formed in a structure where rotations are prevented and is classified in two types of guides.

A first type of guide is designed and formed by coupling an air cylinder and a LM (linear motion) guide, mostly as a miniature type, and a second type of guide is designed and formed by coupling an air cylinder and a slide guide, it is applied in a quadratic form.

There are, however, problems of causing about 0.2~0.4 mm trembles since the two types have a short durability on straightness and the location accuracy is low within the stroke.

In addition, the slide type has a durability which is ⅓ shorter compared to the LM guide type.

Consequently, the research development of a guide with a high durability on straightness and a high precision and of a picker actuator using the same has been demanded by solving the problems from the air cylinder and the LM guide, and the air cylinder and the slide guide.

SUMMARY

The present invention has been made keeping in mind the drawbacks of the related art, and an object of the invention is to provide a polygonal ball cage in an integrated form to keep the high precision when performing a linear reciprocating motion so that the rolling motion is enabled by forming ball receiving holes on each side of the polygonal ball cage for receiving a number of balls and by coupling a guide post located inside the ball receiving hole and a housing located outside the ball receiving hole after the balls are inserted into the ball receiving holes.

Another object of the invention is to provide a picker actuator for both minimizing the vibration and the tremble and enhancing the straightness and the durability by performing a linear reciprocating motion in stable from the front, back, left or right directions so that of adopting a constitution in which a plurality of ball receiving holes are formed on each side of the polygonal ball cage of the polygonal guide which is formed integrally, and in which balls are in rolling motions on each side after the balls are inserted in a plurality of the ball receiving holes.

An additional object of the invention is to provide a picker actuator with high straightness and which may minimize the vibration and the tremble in stable in a structure of subjecting to same loads from the front, back, left or right (4 directions), wherein a plurality of ball receiving holes are formed on each side of the polygonal ball cage of a polygonal guide, and the balls are in rolling motion on each side after balls are inserted in the ball receiving holes.

A further object of the invention is to provide a picker actuator which has adopted a polygonal guide with high load and high durability having an integrated polygonal ball cage where a plurality of ball receiving holes are arranged and formed at constant spacing on each side, and the balls are inserted into the ball receiving holes.

In an embodiment a high load and high precision polygonal guide is applied to a picker actuator which is used for transferring small components such as a semiconductor chip and a LED chip sorter. The high load and high precision polygonal guide includes an integrated polygonal ball cage designed and formed in a polygon and having a plurality of ball receiving holes formed on each side of the polygonal ball cage for receiving balls, a housing having a polygonal through hole for rolling motion such that, after the balls are inserted into the ball receiving holes formed on each side of the polygonal ball cage, the balls cannot escape from the ball receiving holes, and a guide post is inserted and fitted inside the polygonal ball cage into which balls are inserted and fitted.

Preferably, a polygonal minimizes the vibration and the trembles with stable precision by subjecting to same loads from the front, back, left or right (4 directions) and has enhanced straightness and durability, wherein a plurality of ball receiving holes are formed on each side of a polygonal integrated guide, and the balls are in rolling motion on each side after balls are inserted in the ball receiving holes.

Preferably, a picker actuator includes high durability and high precision degree for transferring small components such as a semiconductor chip and a LED chip sorter, and the picker actuator includes a polygonal guide including a ball cage designed and formed in a polygon and having a plurality of ball receiving holes formed on each side of the polygonal ball cage for receiving balls, a housing having a polygonal through hole by the polygonal ball cage where the balls are inserted and fitted into the ball receiving holes, and a guide post inserted and fitted inside the polygonal ball cage; a fixing bracket for coupling the guide post of the polygonal guide and a cylinder rod of the power cylinder, wherein the housing of the polygonal guide and a housing of the power cylinder are formed integrally, whereby the guide post or the housing performs the linear reciprocating motion for a certain distance by using the cylinder.

Preferably, a picker actuator includes a plurality of ball receiving holes formed on each side of integrated polygonal ball cage, by fitting and fixing the guide post of the polygonal guide to the edge of the power cylinder rod with the fixing bracket by using the polygonal guide formed to allow the balls to perform rolling motion on each sides, and by constituting the fixing bracket or the housing to perform limiting stroke with the power cylinder by forming the housing of the polygonal guide and the cylinder housing integrally.

According to the present disclosure, a high load and high precision polygonal guide has an advantageous effect of maintaining high precision degree when performing a linear reciprocating motion by forming a polygonal ball cage, wherein ball receiving holes for receiving a number of balls are formed on each of the polygonal surfaces at constant spacing and wherein the guide post locating inside and the housing locating outside are coupled by inserting balls into the ball receiving holes to perform a rolling motion.

Preferably, a picker actuator can minimize the vibration and trembles to stable precision degree from the front, back, left or right directions and to enhance the straightness and the durability by forming a plurality of ball receiving holes on each sides of integrated polygonal ball cage and by inserting and fitting the balls in the ball receiving holes so that the balls performs rolling motion on each side.

Preferably, a high load and high precision polygonal guide and a picker actuator can minimize the vibration and tremble in stable in a structure of subjecting to same loads from the front, back, left or right (4 directions), wherein a plurality of ball receiving holes are formed on each ball cage sides of a polygonal guide, and the balls are in rolling motion on each of the surfaces after balls are inserted in the ball receiving holes.

Preferably, a picker actuator can be adopted a polygonal guide with high load and high durability having an integrated polygonal ball cage where a plurality of ball receiving holes are arranged and formed at constant spacing on each sides, and the balls are inserted into the ball receiving holes.

BRIEF DESCRIPTION OF MARKS IN DRAWINGS

Figure 1:
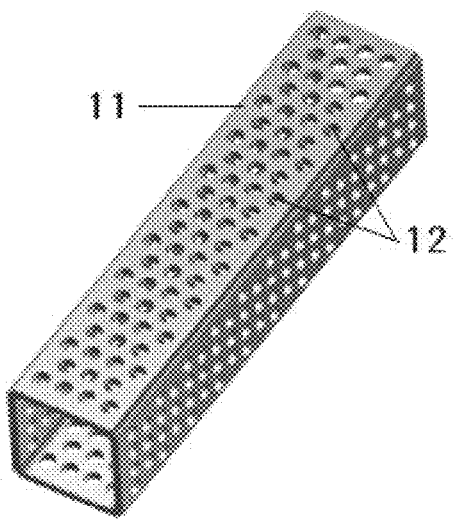
FIG. 1 is a view illustrating an integrated polygonal ball cage coupled inside a polygonal guide.

11; a ball cage 12; ball receiving holes
21; a polygonal ball cage 23; balls
31, 41, 51; a guide post 32, 42, 52; a polygonal ball cage
33, 43, 53; a polygonal guide housing
61; a guide post 62; a polygonal ball cage
63; a housing or integrated housing 64; a cylinder
65; a cylinder rod 66; a fixing bracket
67; an air outlet 68; an air suction port
69; a stopper 70; an air inlet or an oil inlet
71; an air outlet or an oil outlet 72; a shock absorbing spring
73; an oil flow path
X; upper diameter of a ball receiving hole
Y; lower diameter of a ball receiving hole

DETAILED DFSCRIPTION

A high load and high precision polygonal guide according to the invention, which is applied to a picker actuator for transferring small components such as a semiconductor chip and LED chip sorter, includes an integrated polygonal ball cage designed and formed in a polygon and having a plurality of ball receiving holes formed on each side of the polygonal ball cage for receiving balls, a housing having a polygonal through hole for rolling motions such that, after the balls are inserted into the ball receiving holes formed on each side of the polygonal ball cage, the balls cannot escape from the ball receiving holes, and a guide post inserted and fitted inside the polygonal ball cage into which the balls are inserted and fitted, whereby the guide post or the housing performs a linear reciprocating motion by rolling motion of the balls.

A picker actuator according to the invention has high durability and high precision degree for transferring small components such as a semiconductor chip and a LED chip sorter, wherein the picker actuator includes a polygonal guide including a ball cage designed and formed in a polygon and having a plurality of ball receiving holes formed on each side of the polygonal ball cage for receiving balls, a housing having a polygonal through hole by the polygonal ball cage where the balls are inserted and fitted into the ball receiving holes, and a guide post inserted and fitted inside the polygonal ball cage; a fixing bracket for fitting the guide post of the polygonal guide and a cylinder rod of the power cylinder, wherein the housing of the polygonal guide and a housing of the power cylinder are formed integrally, whereby the guide post or the housing performs the linear reciprocating motion for a certain distance by using the cylinder.

EXAMPLE 1

A specific example 1 according to the invention will be explained with reference to the drawings.

The example 1 relates to a polygonal guide with high precision, high durability and high straightness according to the invention. The technical configuration of the polygonal guide according to the invention is as follows based on FIG. 1 to FIG. 5.

Figure 2:
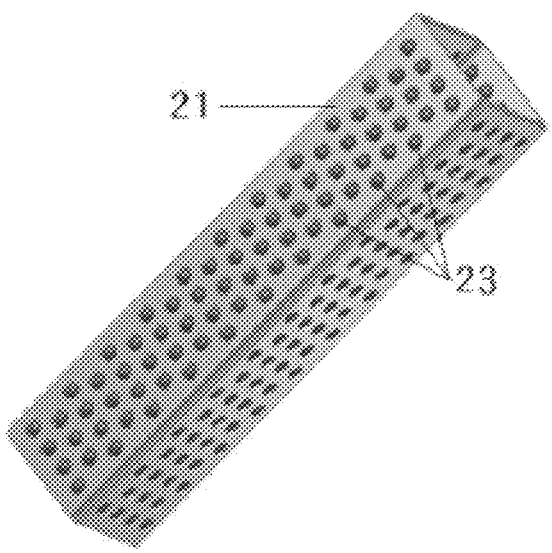
FIG. 2 is a view illustrating an integrated polygonal ball cage of FIG. 1 into which balls are inserted.

FIG. 1 illustrates an integrated polygonal ball cage coupled inside a polygonal guide, and FIG. 2 illustrates the integrated polygonal ball cage of FIG. 1 into which balls are inserted.

Figure 3:
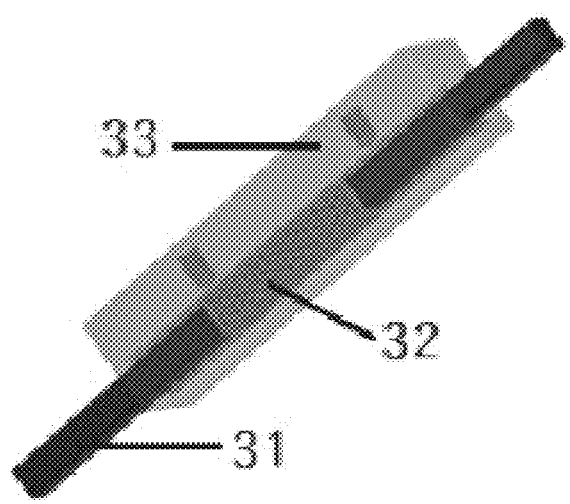
FIGS. 3 to 5 are views illustrating a polygonal guide having a polygonal ball cage with inserted and coupled balls in which a guide post and a different form of housing are assembled.
Figure 4:
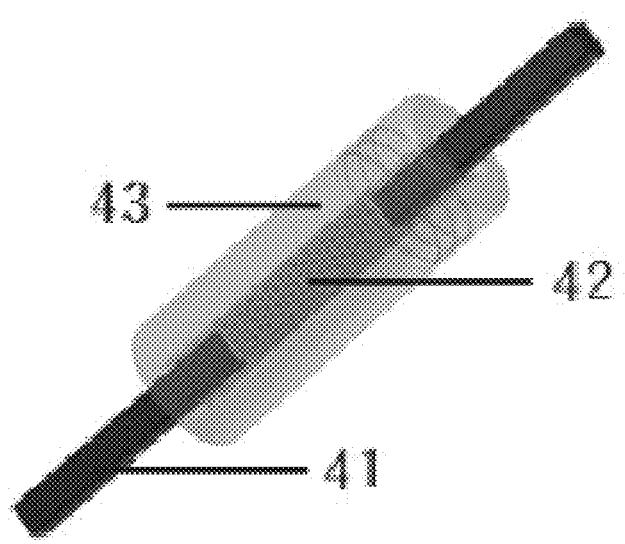
Figure 5:
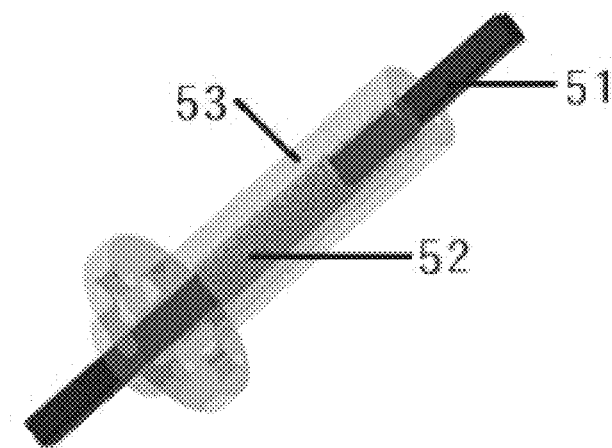

FIGS. 3 to 5 illustrate a polygonal guide having the polygonal ball cage with inserted and fitted balls in which a guide post and a different form of housing are coupled.

FIGS. 3 to 5 illustrates a polygonal guide which is adapted to a picker actuator used for transferring small components such as a semiconductor chip and a LED chip sorter.

The straightness of the polygonal guide according to the invention maintains 10 but under 0.01 as performing linear motions.

For a specific example, the polygonal guide according to the invention can be adapted to a picker actuator transferring a LED chip with size of 0.5×0.5.

The polygonal guide includes a polygonal ball cage (12 in FIG. 1) in which a plurality of ball receiving holes are formed on each side of the polygonal ball cage for receiving a plurality of balls (23 in FIG. 2).

Figure 7:
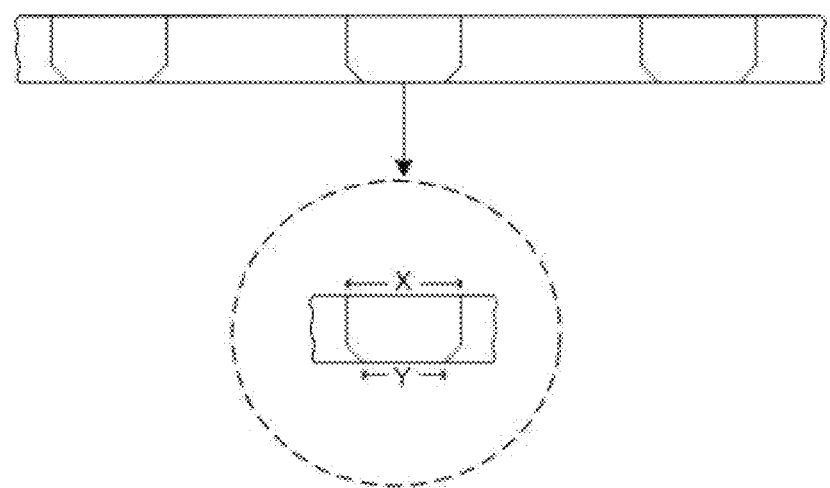
FIG. 7 is a view illustrating ball receiving holes formed in the polygonal ball cage in accordance with the invention.

FIG. 1 illustrates a ball cage according to the invention in which ball receiving holes for receiving balls are formed, and FIG. 2 illustrates a polygonal ball cage with balls accommodated in balls receiving holes. FIG. 7 illustrates specifically a formation of ball receiving holes (12 in FIG. 1) formed in the polygonal ball cage as an example.

In FIG. 2, when the diameter of a ball (23 in FIG. 2) is 0.6 as a specific example, the diameter of X where the ball is inserted is determined to 0.7 and the diameter of Y, a ball blocking member, which plays roles of holding the ball not to be passed through is determined to 0.5.

Further, it is easy to assemble since the ball cannot pass through when the ball locates in the ball receiving hole formed in the polygonal ball cage. Having the diameter of X as 0.7 enables the ball to freely perform rolling motion inside the polygonal ball cage.

It is reasonable to form a ball blocking member with diameter of 0.5 in the lower part of the ball receiving hole which is formed vertically down to reduce the contact area ball when forming ball receiving holes in a ball cage, allowing an efficient rolling by minimizing the contact area (friction area) between the ball in rolling motion and the polygonal ball cage according to FIG. 7.

When fabricating a guide post, a cage and ball in the same size shown in the previous example, the housing locating outside of the polygonal guide can be determined very narrowly as width of 7.

In FIG. 7, considering the size of a ball, the size of diameter of X is determined to be larger than the diameter of the ball and the size of diameter of Y is determined to be just enough for the ball to not pass through, which makes assembling easy and allows rolling motion smoothly.

In FIGS. 3 to 5, the thickness of the polygonal ball cage (32 in FIG. 3) is designed and formed smaller than the diameter of the ball to minimize the friction the guide post (31 in FIG. 3) locating inside the polygonal ball cage and the housing (33 in FIG. 3) locating outside the polygonal ball cage and to reduce the friction power with the ball accommodated in the ball receiving hole.

A polygonal guide includes a housing designed and formed to allow the ball to freely perform rolling motion without escaping from the ball receiving hole, after the balls are inserted and fitted in the ball receiving holes formed in the polygonal ball cage.

A polygonal guide includes a guide post coupled to a polygonal through hole, which passes through the housing, after the ball is inserted and fitted in the ball receiving hole, allowing the guide post perform a linear reciprocating motion by the rolling motion of the ball.

According to a specific example based on FIGS. 3 to 5, when designing and fabricating a guide post in the form of square, the width of one side of the guide post is determined to be 3.9 and the width of one side of the square through hole being formed in the polygonal housing is determined to be 5.1 when having ball with diameter of 0.6 as suggested in previous example.

The width of 5.1 of one side of square through hole is a figure adding 1.2 (double the diameter of a ball) to 3.9 which is the width of one side of the guide post. The diameter of a ball is doubled since space as much as the width of the ball is needed when inserting and fitting the ball on each side of the polygonal ball cage facing each other.

That is, it is reasonable to determine the spacing between the polygonal guide post and the housing having polygonal through hole as the size of diameter of the ball to form a high precision polygonal guide.

The spacing formed between the guide post and the housing, and the number of balls accommodated on each surface can be changed and be applied considering the durability, the precision degree, the size of a ball, and the friction power in rolling motion.

The high load and high precision polygonal guide can be embodied when forming with fixed figure as shown in the example, and when constituting the balls accommodated on each side of an integrated polygonal ball cage to perform a linear reciprocating motion by the rolling motion.

The formation of the housing can be formed by choosing one among polygon, square, rectangle, and flange or can be changed, designed and formed in various forms according to the purpose and the user.

A polygonal guide of the invention is for stroke-limiting.

EXAMPLE 2

A specific example 2 according to the invention will be explained with reference to the drawings.

An example 2 relates to a light picker actuator which has adopted a polygonal guide having a high precision, high durability and high straightness designed and formed by the example 2 according to the invention. The technical figuration of the light picker actuator according to the example 2 of the invention is as follows based on FIG. 6.

A stroke-limiting polygonal guide designed and formed according to the invention requires a guide with high straightness and high precision degree and requires high durability since the polygonal guide is adopted and applied to a light picker actuator (also known as a 'miniature') for transferring very small LED chips etc.

Figure 6:
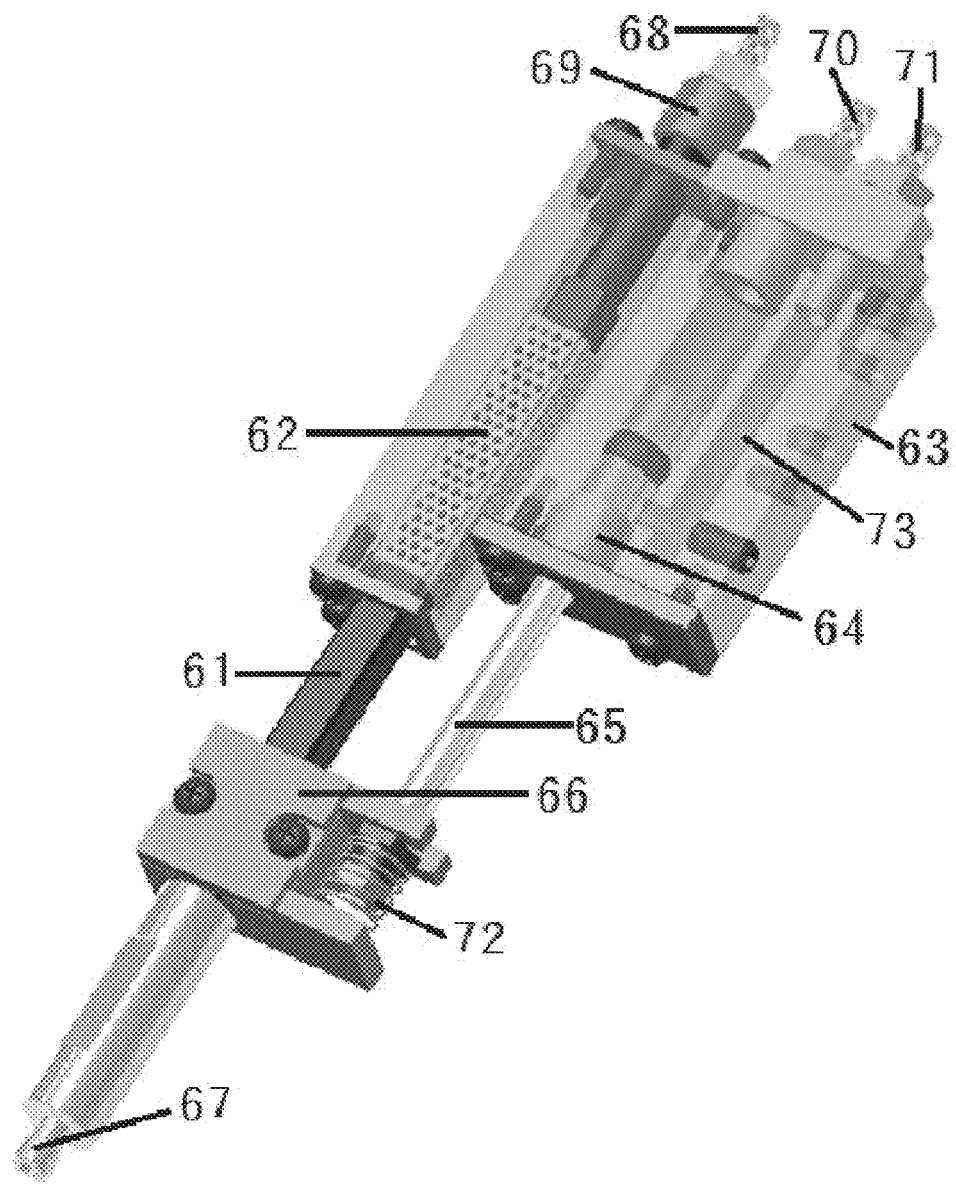
FIG. 6 is a view illustrating a picker actuator which is adopting the polygonal guide in accordance with the invention.

The configuration of the light picker actuator according to the invention will be followed referring to FIG. 6. The picker actuator of example 2 adopts a polygonal guide designed and formed according to example 1, and allows the balls to perform a linear reciprocating motion by a power cylinder, whereby the picker actuator can transfer small components such as a semiconductor chip and a LED chip sorter.

More specifically, the polygonal guide includes a light ball cage designed and formed in a polygon according to example 1 and having a plurality of ball receiving holes formed, at constant spacing, on each side of the polygonal ball cage for receiving balls, includes a housing having a polygonal through hole by inserting and fitting the polygonal ball cage according to a form of the polygonal ball cage where the balls are inserted and fitted into the ball receiving holes, and includes a polygonal guide post inserted and fitted inside the polygonal ball cage into which the balls are inserted and fitted.

The picker actuator is constituted to have high durability and high straightness, wherein the picker actuator includes a fixing bracket for fitting the guide post of the polygonal guide and a cylinder rod of the power cylinder, and the housing of the polygonal guide and a housing of the power cylinder are formed integrally so that the guide post or the housing performs the linear reciprocating motion for a certain distance by using the power cylinder.

The picker actuator includes the guide post, wherein the guide post includes an air flow path formed in the middle part of the guide post to suck air instantaneously to catch small objects, and includes an air or oil flow path, and an air or oil inlet and outlet for injecting or discharging the air or the oil into the power cylinder so that the balls perform the linear reciprocating motion to transfer the captured object.

In addition, the picker actuator according to the invention provides a wide contact area of the ball in rolling motion on each of the surfaces of the polygonal guide to enhance the load-bearing ability, forms the polygonal guide with an integrated ball cage, couples and fixes the guide post (61 in FIG. 6) of the polygonal guide to the edge of the cylinder rod (65 in FIG. 6) with a fixing bracket, and forms the housing (63 in FIG. 6) of the polygonal guide and the cylinder housing integrally so that the fixing bracket or the housing may perform stroke-limiting by using the power cylinder (64 in FIG. 6).

It is reasonable to form the polygonal ball cage (62 in FIG. 6) integrally with synthetic resin having high durability or light metal for the picker actuator to have high durability, high load and high straightness. Of course, the polygonal ball cage can be designed and formed in different structure beside the integral form.

The polygonal ball cage enhances the durability of the polygonal ball cage since the cage is formed integrally, whereby improves the durability of the picker actuator.

The power source of operating the picker actuator may be a pneumatic cylinder using air pressure or a hydraulic cylinder using oil pressure.

In FIG. 6, the air or oil inlet (70 in FIG. 6) and the oil outlet (71 in FIG. 6) are fixed and installed to be protruded on upper right side of the picker actuator, and the oil inlet and the oil outlet may swap each other's role.

The picker actuator is a very small device to perform the linear reciprocating motions for distance of 5 to 15, so it is not easy to install separate structure to catch small objects. Therefore, the picker actuator includes an air flow path in the middle part of the guide post to catch small objects by using suction power of the air, an air suction port (68 in FIG. 6) in the upper part of the guide post, and an air outlet (67 in FIG. 6) in the lower part of the guide post, whereby the air outlet sucks the air, the air suction port catches the object with the air suction power, and the object may fall off by stopping the air suction or injecting air.

A stopper (69 in FIG. 6) is installed and fixed in the lower part of the air suction port so that the housing cannot move to upper part anymore by the cylinder.

The picker actuator includes a polygonal through hole, formed in the housing (63 in FIG. 6), where the balls are in rolling motion to perform the finite linear reciprocating motion for a certain distance, and also to perform the linear reciprocating motion for a certain distance with high straightness by the power from the power cylinder.

The formation of the housing may be formed as the formation of FIG. 6, or it is a reasonable configuration of fabricating the housing in the integral rectangular form.

The housing includes an air or oil flow path (73 in FIG. 6) for injecting or discharging air into the pneumatic cylinder or the hydraulic cylinder as shown in FIG. 6.

The power cylinder can be the pneumatic cylinder operated by the air pressure or the hydraulic cylinder operated by the air pressure. The power cylinder should have the technical configuration of enabling the movement of the piston of the cylinder the by installing the air or oil inlet (70 in FIG. 6) and outlet (71 in FIG. 6) on the one side of the housing and injecting and/or discharging the air or the oil into the cylinder.

A shock-absorbing spring (72 in FIG. 6) is comprised in the lower part of the cylinder rod (65 in FIG. 6), and the spring absorbs the shock occurring when injecting the air or oil, or when catching or releasing the object.

The shock-absorbing spring may not be adopted according to the case.

The method of constituting the linear reciprocating motion by coupling with the power cylinder can be categorized into two types of technical configuration. One is to couple the guide post (61 in FIG. 6) of the polygonal guide to the edge of the pneumatic or the hydraulic cylinder rod (65 in FIG. 6) with the fixing bracket (66 in FIG. 6), and to fix the housing of the guide post and the power cylinder to the one side of the polygonal ball cage so that the guide post and the cylinder rod that are fixed by the fixing bracket can perform the linear reciprocating motion. The other one is to fix the guide post and the cylinder rod that are coupled with the fixing bracket to the one side of the polygonal ball cage so that the housing can perform the linear reciprocating motion.

The picker actuator according to the invention is for stroke-limiting.

The example 2 describes the picker actuator with high load, high durability and high straightness by assigning figures. This example is just one example and can be changed and carried out variously. Also these modified examples are included to the extent of the right of the invention.

EXAMPLE 3

The example 3 according to the invention relates to a picker actuator adopting a cylindrical ball cage.

The cylindrical ball cage has a configuration, wherein ball receiving holes are formed at constant spacing, balls are inserted and fitted in the ball receiving holes, a cylindrical guide post is inserted and fitted on the inside the polygonal ball cage, and a housing is coupled on the outside of the polygonal ball cage, whereby the balls perform the linear reciprocating motion for a certain distance.

The example 3 can be used for different purpose since the housing or the guide post rotate, unlike the polygonal guide applied to the examples 1 and 2.

The picker actuator includes a cylindrical ball cage, wherein the cylindrical guide post is inserted and fitted inside the polygonal ball cage after balls are inserted and fitted into the ball receiving holes formed in the cylindrical ball cage, and the polygonal ball cage is coupled with the housing having the cylindrical through hole to design and form the cylindrical guide.

All technical configurations except for the cylindrical guide are omitted since they are identical to the picker actuator having the polygonal guide of the example 2.

The picker actuator using the cylindrical guide of the example according to the invention is also for stroke-limiting.

High load and high precision polygonal guide and picker actuator using same are highly available in commerce, wherein the guide includes; an integrated polygonal ball cage designed and formed in a polygon and having a plurality of ball receiving holes formed on each side of the polygonal ball cage for receiving balls; a housing having a polygonal through hole for rolling motions such that, after the balls are inserted into the ball receiving holes formed on each side of the polygonal ball cage, the balls cannot escape from the ball receiving holes; and a guide post inserted and fitted inside the polygonal ball cage into which the balls are inserted and fitted, whereby the guide post or the housing performs a linear reciprocating motion by rolling motion of the balls.

What is claimed is:

1. A polygonal guide comprising:
   a ball cage formed in a polygon and having a plurality of ball receiving holes formed on each side of the polygonal ball cage for receiving balls;
   a housing having a polygonal through hole for allowing a rolling motion of the balls by the polygonal ball cage, wherein the balls are inserted and fitted into the ball receiving holes; and
   a guide post inserted and fitted inside the polygonal ball cage into which the balls are inserted and fitted, whereby the housing performs a linear reciprocating motion by the rolling motion of the balls.

2. The polygonal guide according to claim 1, wherein an upper diameter of each ball receiving hole is formed to be larger than a diameter of the ball to allow the rolling motion of the balls;
   an upper diameter in each ball receiving hole is formed vertically down to reduce the contact area with the ball and the ball receiving hole; and
   a ball blocking member is formed in a lower part of each ball receiving hole to support the ball to be not passed through.

3. The polygonal guide according to claim 1, the polygonal ball cage is formed integrally in molded to improve a durability and a precision degree, and the spacing among each of the polygonal surface, the guide post and the housing is formed to a diameter of the ball accommodated in the polygonal ball cage.

4. The polygonal guide according to claim 3, wherein the polygonal guide performs a stroke-limiting motion.

* * * * *